(12) United States Patent
Pan et al.

(10) Patent No.: US 7,702,968 B2
(45) Date of Patent: Apr. 20, 2010

(54) EFFICIENT MULTI-SYMBOL DEINTERLEAVER

(75) Inventors: Hanfang Pan, San Diego, CA (US); Inyup Kang, San Diego, CA (US); James Krysl, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 442 days.

(21) Appl. No.: 10/789,605

(22) Filed: Feb. 27, 2004

(65) Prior Publication Data
US 2005/0190864 A1 Sep. 1, 2005

(51) Int. Cl.
*H03M 13/03* (2006.01)
*G06F 11/00* (2006.01)
*G11C 29/00* (2006.01)

(52) U.S. Cl. ........................ 714/701; 714/702; 714/787; 714/788

(58) Field of Classification Search .................. 714/701, 714/702, 787, 788
See application file for complete search history.

(56) References Cited

U.S. PATENT DOCUMENTS

| | | | | |
|---|---|---|---|---|
| 4,063,038 A * | 12/1977 | Kaul et al. | .................. | 370/545 |
| 4,901,319 A * | 2/1990 | Ross | .................. | 714/788 |
| 5,311,553 A | 5/1994 | Chennakeshu et al. | | |
| 5,742,640 A * | 4/1998 | Haoui et al. | ................. | 375/220 |
| 5,946,293 A * | 8/1999 | Beale et al. | .................. | 370/210 |
| 6,392,572 B1 * | 5/2002 | Shiu et al. | ..................... | 341/81 |
| 6,496,543 B1 * | 12/2002 | Zehavi | ....................... | 375/295 |
| 6,529,559 B2 * | 3/2003 | Reshef | ........................ | 375/262 |
| 6,603,412 B2 * | 8/2003 | Gatherer et al. | ................ | 341/61 |
| 6,798,852 B2 * | 9/2004 | Khayrallah et al. | ......... | 375/341 |
| 6,907,084 B2 * | 6/2005 | Jeong | ......................... | 375/261 |
| 2002/0065859 A1 | 5/2002 | Bars et al. | .................... | 708/109 |
| 2002/0124227 A1 | 9/2002 | Nguyen | ....................... | 714/786 |
| 2003/0126550 A1 | 7/2003 | Van Stralen et al. | ......... | 714/786 |

FOREIGN PATENT DOCUMENTS

EP  1175014  1/2000

(Continued)

OTHER PUBLICATIONS

Wu, Qiang et al. "The cdma2000 High Rate Packet Data System", QUALCOMM Incorporated. (Mar. 26, 2002). pp. i-8-1

(Continued)

*Primary Examiner*—Joseph D Torres
(74) *Attorney, Agent, or Firm*—Sayed H. Beladi

(57) ABSTRACT

Embodiments disclosed herein address the need in the art for an efficient multi-symbol deinterleaver. In one aspect, a plurality of memory banks are deployed to receive and simultaneously store a plurality of values, such as soft decision values determined from a modulation constellation, in accordance with a storing pattern. In another aspect, the storing pattern comprises a plurality of cycles, a selected subset of the plurality of memory banks and an address offset for use in determining the address for storing into the respective memory banks indicated for each cycle. In yet another aspect, the stored values may be accessed in order with a sequentially increasing index, such as an address. Various other aspects are also presented. These aspects have the benefit of allowing multiple symbol values to be deinterleaved in an efficient manner, thus meeting computation time constraints, and conserving power.

42 Claims, 10 Drawing Sheets

FOREIGN PATENT DOCUMENTS

| | | |
|---|---|---|
| EP | 1324527 | 12/2002 |
| WO | 0010255 | 2/2000 |
| WO | 0038333 | 6/2000 |
| WO | 0060750 | 10/2000 |

OTHER PUBLICATIONS

TIA/EIA. "cdma 2000 High Rate Packet Data Air Interface Specification". TIA/EIA/IS-856. (Nov. 2000). pp. i-11-5.

International Search Report—PCT/US05/006635, International Search Authority—European Patent Office—Aug. 26, 2005.

Written Opinion—PCT/US05/006635, International Search Authority—European Patent Office—Aug. 26, 2005.

International Preliminary Examination Report—PCT/US05/006635—IPEA/US—Mar. 6, 2009.

\* cited by examiner

16QAM (5K PACKET)

| U0 | ... | U1279 | V0 0 | ... | V0 1279 | V0 1280 | ... | V0 2559 |
|---|---|---|---|---|---|---|---|---|
| U1280 | ... | U2559 | V0 2560 | ... | V0 3839 | V0 3840 | ... | V0 5119 |
| U2560 | ... | U3839 | V0'0 | ... | V0'1279 | V0'1280 | ... | V0'2559 |
| U3840 | ... | U5119 | V0'2560 | ... | V0'3839 | V0'3840 | ... | V0'5119 |
| | U | | | | V0/V0' | | | |

16QAM (4K PACKET)

| U0 | ... | U1023 | V0 0 | ... | V0 1023 | V0 1024 | ... | V0 2047 |
|---|---|---|---|---|---|---|---|---|
| U1024 | ... | U2047 | V0 2048 | ... | V0 3071 | V0 3072 | ... | V0 4095 |
| U2048 | ... | U3071 | V0'0 | ... | V0'1023 | V0'1024 | ... | V0'2047 |
| U3072 | ... | U4095 | V0'2048 | ... | V0'3071 | V0'3072 | ... | V0'4095 |
| | U | | | | V0/V0' | | | |

8PSK (3K PACKET)

| U0 | ... | U1023 | V0 0 | ... | V0 1023 | V0 1024 | ... | V0 2047 |
|---|---|---|---|---|---|---|---|---|
| U1024 | ... | U2047 | V0 2048 | ... | V0 3071 | V0'0 | ... | V0'1023 |
| U2048 | ... | U3071 | V0'1024 | ... | V0'2047 | V0'2048 | ... | V0'3071 |
| | U | | | | V0/V0' | | | |

QPSK (2K PACKET)

| U0 | ... | U1023 | V0 0 | ... | V0 2047 | V1 0 | ... | V1 2047 |
|---|---|---|---|---|---|---|---|---|
| U1024 | ... | U2047 | V0'0 | ... | V0'2047 | V1'0 | ... | V1'2047 |
| | U | | | V0/V0' | | | V1/V1' | |

EFFICIENT MULTI-SYMBOL DEINTERLEAVER

BACKGROUND

1. Field

The present invention relates generally to wireless communications, and more specifically to efficient deinterleaving of multiple symbol streams.

2. Background

Wireless communication systems are widely deployed to provide various types of communication such as voice and data. A typical wireless data system, or network, provides multiple users access to one or more shared resources. A system may use a variety of multiple access techniques such as Frequency Division Multiplexing (FDM), Time Division Multiplexing (TDM), Code Division Multiplexing (CDM), and others.

Example wireless networks include cellular-based data systems. The following are several such examples: (1) the "TIA/EIA-95-B Mobile Station-Base Station Compatibility Standard for Dual-Mode Wideband Spread Spectrum Cellular System" (the IS-95 standard), (2) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (the W-CDMA standard), (3) the standard offered by a consortium named "3rd Generation Partnership Project 2" (3GPP2) and embodied in "TR-45.5 Physical Layer Standard for cdma2000 Spread Spectrum Systems" (the IS-2000 standard), and (4) the high data rate (HDR) system that conforms to the TIA/EIA/IS-856 standard (the IS-856 standard).

As data rates supported by wireless communication systems have continued to increase, the computation requirement has increased accordingly. For example, to increase data rate, a higher order modulation may be used as well as an increase in coding gain. This computation may require increased clock frequency at the mobile station or a more efficient architecture to reduce the computation requirements while achieving the same system performance. For example, the HDR Release A standard targets a data rate of 3.1 Mbps. Support of this data rate requires 50 percent more computation complexity to achieve similar performance achieved with the previous highest HDR data rate of 2.4 Mbps.

One solution to increase computation is to increase the operating frequency of the circuit. However, an increase in frequency translates into higher power consumption, which is undesirable in many instances, such as a battery-powered mobile station. Furthermore, some circuits have limitations preventing them from operating reliably outside of certain clock frequencies.

In a system such as the IS-856 standard, the turbo decoder may be the single most computationally intensive block. The amount of time allowed for deinterleaving and decoding in an HDR system must be less than the HDR slot time, i.e. 1.66 ms, to satisfy the acknowledgement requirement. In order to meet this requirement while also keeping the clock rate at an acceptable level to conserve power, the number of computations for deinterleaving and decoding must be reduced.

It is generally desirable to deliver symbols in sequential order to a decoder, such as a turbo decoder. In a prior art implementation, to simplify the delivery of the demodulated symbols to the decoder, a symbol may be demodulated more than once. A symbol demodulation may yield more than one demodulated symbol per cycle (i.e. 4 demodulated symbols from one 16 QAM symbol). Thus, multiple symbol streams are generated simultaneously. One result of each demodulation is stored in a memory at a time. Using a single memory and storing the demodulated symbols in sequential order may have provided a simplified design and/or data interface configuration, but at high data rates, such an architecture may not provide the bandwidth required for the decoding computation with a reasonable clock frequency. There is therefore a need in the art for an efficient multi-symbol deinterleaver.

SUMMARY

Embodiments disclosed herein address the need in the art for an efficient multi-symbol deinterleaver. In one aspect, a plurality of memory banks are deployed to receive and simultaneously store a plurality of values, such as soft decision values determined from a modulation constellation, in accordance with a storing pattern. In another aspect, the storing pattern comprises a plurality of cycles, a selected subset of the plurality of memory banks and an address offset for use in determining the address for storing into the respective memory banks indicated for each cycle. In yet another aspect, the stored values may be accessed in order with a sequentially increasing index, such as an address. Various other aspects are also presented. These aspects have the benefit of allowing multiple symbol values to be deinterleaved in an efficient manner, thus meeting computation time constraints, and conserving power.

BRIEF DESCRIPTION OF THE DRAWINGS

FIG. 5 shows example interleaver matrix results for a 5K packet modulated using 16 QAM and rate 1/3 encoding;

FIG. 6 shows example interleaver matrix results for a 4K packet modulated using 16 QAM and rate 1/3 encoding;

FIG. 7 shows example interleaver matrix results for a 3K packet modulated using 8 PSK and rate 1/3 encoding;

FIG. 8 shows example interleaver matrix results for a 2K packet modulated using QPSK and rate 1/3 encoding.

DETAILED DESCRIPTION

Figure 1:
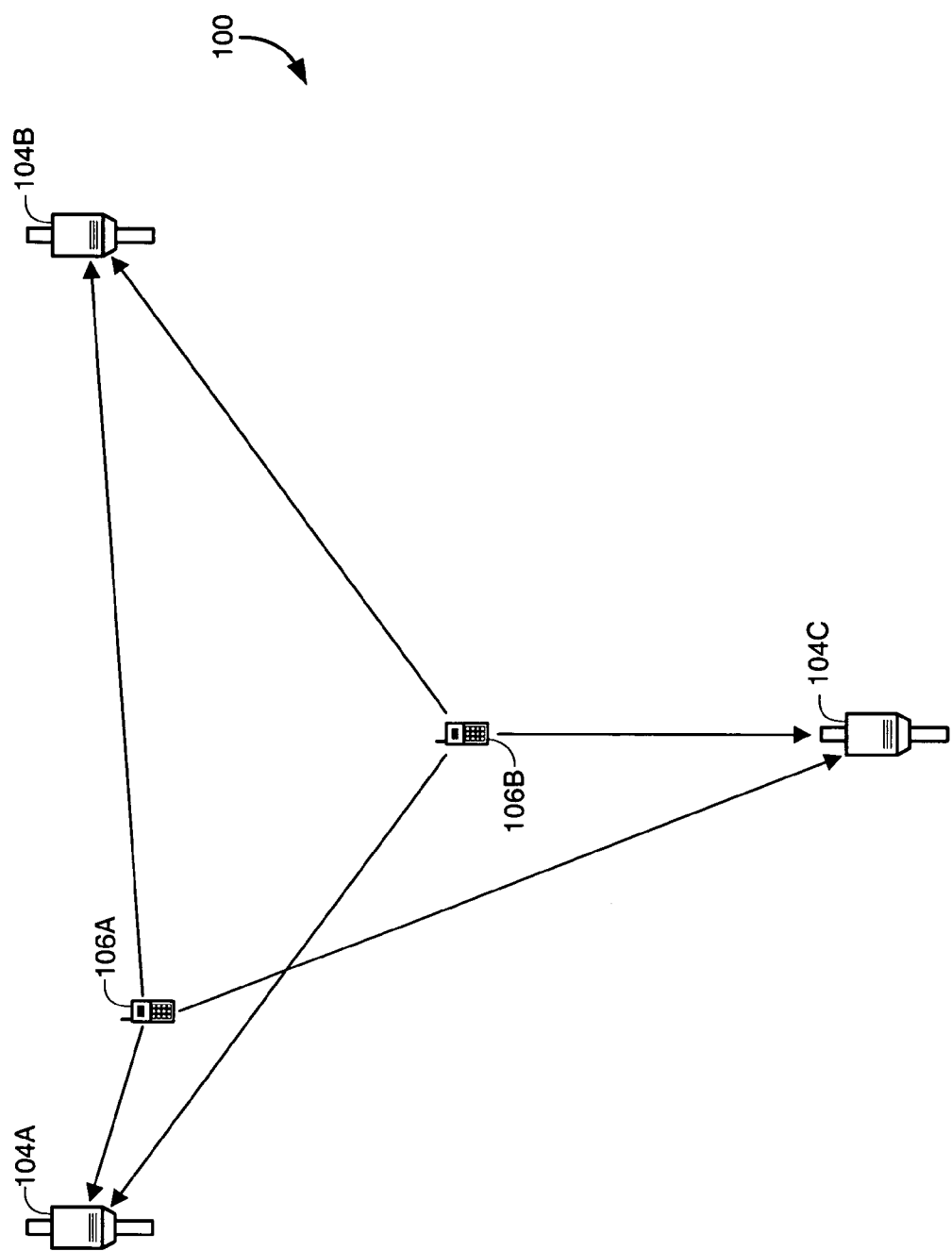
FIG. 1 is a general block diagram of a wireless communication system capable of supporting a number of users.

FIG. 1 is a diagram of a wireless communication system 100 that may be designed to support one or more wireless standards and/or designs (e.g., the W-CDMA standard, the IS-95 standard, the cdma2000 standard, the HDR specification, the 1×EV-DV proposal, the GSM standard). In the exemplary embodiment, system 100 supports the IS-856 (HDR) standard.

For simplicity, system 100 is shown to include three base stations 104 in communication with two mobile stations 106. The base station and its coverage area are often collectively referred to as a "cell". In IS-95 systems, a cell may include one or more sectors. In the W-CDMA specification, each sector of a base station and the sector's coverage area is referred to as a cell. As used herein, the term base station can be used interchangeably with the terms access point or Node B. The term mobile station can be used interchangeably with the terms user equipment (UE), subscriber unit, subscriber station, access terminal, remote terminal, or other corresponding terms known in the art. The term mobile station encompasses fixed wireless applications. A mobile station is an example of a wireless communication device.

Depending on the system being implemented, each mobile station 106 may communicate with one (or possibly more) base stations 104 on the forward link at any given moment, and may communicate with one or more base stations on the reverse link depending on whether or not the mobile station is in soft handoff. The forward link (i.e., downlink) refers to transmission from the base station to the mobile station, and the reverse link (i.e., uplink) refers to transmission from the mobile station to the base station.

For clarity, the examples used in describing this invention may assume base stations as the originator of signals and mobile stations as receivers and acquirers of those signals, i.e. signals on the forward link. Those skilled in the art will understand that mobile stations as well as base stations can be equipped to transmit data as described herein and the aspects of the present invention apply in those situations as well. The word "exemplary" is used exclusively herein to mean "serving as an example, instance, or illustration." Any embodiment described herein as "exemplary" is not necessarily to be construed as preferred or advantageous over other embodiments.

Figure 2:
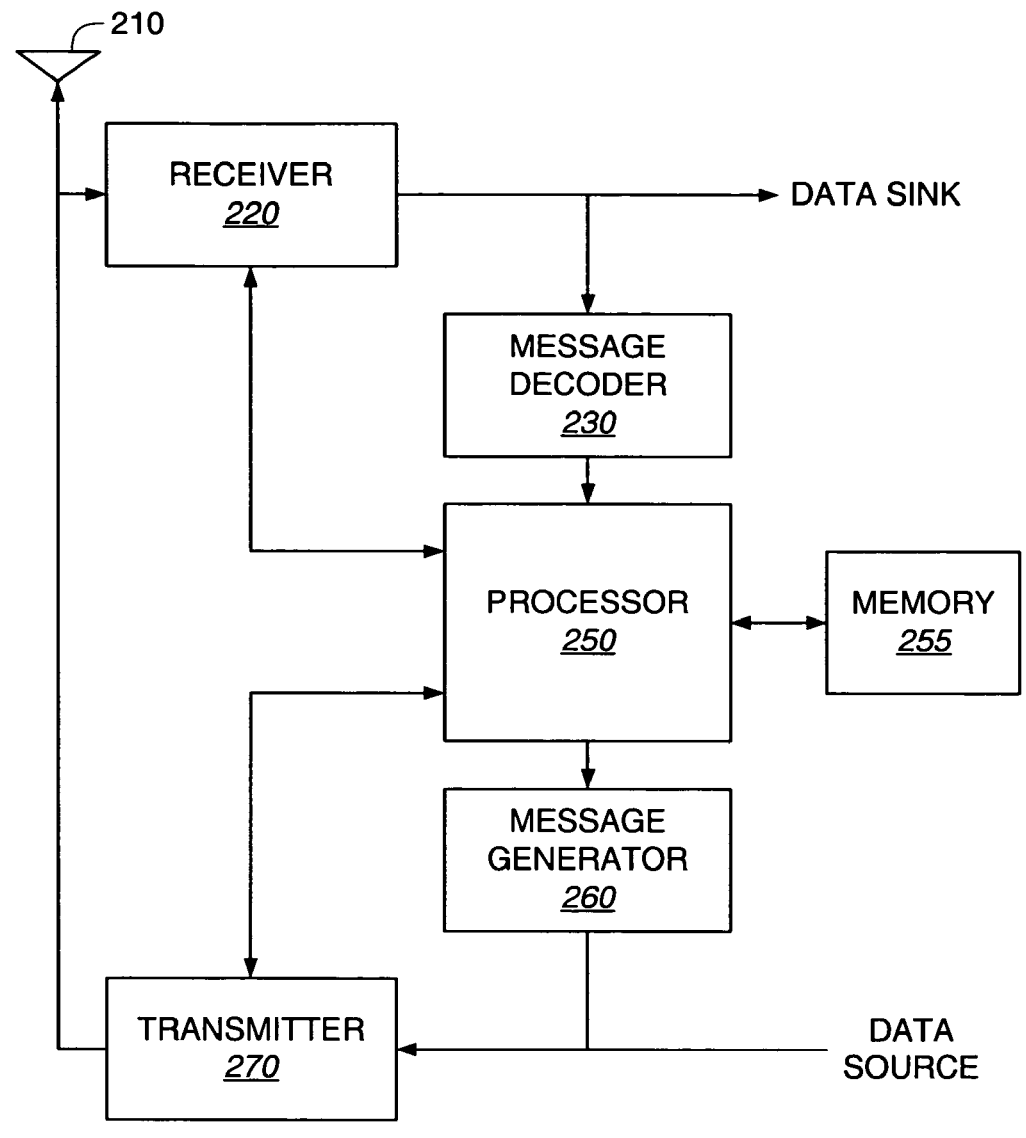
FIG. 2 is a block diagram of a wireless communication device, such as a mobile station or base station.

FIG. 2 is a block diagram of a wireless communication device, such as mobile station 106 or base station 104. The blocks depicted in this example embodiment will generally be a subset of the components included in a mobile station 106 or base station 104. Those of skill in the art will readily adapt the embodiment shown in FIG. 2 for use in any number of configurations.

Signals are received at antenna 210 and delivered to receiver 220. Receiver 220 performs processing according to one or more wireless system standards, such as the standards listed above. Receiver 220 performs various processing such as Radio Frequency (RF) to baseband conversion, amplification, analog to digital conversion, filtering, and the like. Various techniques for receiving are known in the art. Receiver 220 may receive at various frequencies, as programmed by processor 250. Receiver 220 may also include other components, described further below, such as demodulators, deinterleavers, decoders, and the like.

In the example embodiment, a receiver for receiving IS-856 signals is deployed. In alternate embodiments, alternate standards may be supported, and embodiments may or may not support multiple communication formats. Receiving may include RAKE receiving, equalization, combining, deinterleaving, decoding, and various other functions as required by the format of the received signals. Various demodulation techniques are known in the art. Data and control channels are examples of channels that can be received and demodulated in receiver 220. Demodulated, deinterleaved, and decoded data may be delivered to a data sink, which may be any type of application, various examples of which are well known in the art.

Message decoder 230 receives demodulated data and extracts signals or messages directed to a mobile station 106 on the forward or link, or a base station on the reverse link. Message decoder 230 decodes various messages used in setting up, maintaining and tearing down a call (including voice or data sessions) on a system. Various message types are known in the art and may be specified in the various communication standards being supported. The messages are delivered to processor 250 for use in subsequent processing. Some or all of the functions of message decoder 230 may be carried out in processor 250, although a discrete block is shown for clarity of discussion. Alternatively, receiver 220 may decode certain information and send it directly to processor 250 (a single bit message such as an ACK/NAK or a power control up/down command are examples).

Signals are transmitted via antenna 210. Transmitted signals are formatted in transmitter 270 according to one or more wireless system standards, such as those listed above. A data source provides data for transmission. The data source may be any type of data source or application, examples of which are well known in the art. Examples of components that may be included in transmitter 270 are amplifiers, filters, digital-to-analog (D/A) converters, radio frequency (RF) converters, and the like. Transmitter 270, detailed further below, may also comprise modulators, spreaders, encoders, interleavers and other functions. Data and control channels can be formatted for transmission in accordance with a variety of formats.

Message generator 260 may be used to prepare messages of various types, as required to set up, maintain, and/or tear down a voice call or data session. Various types of control messages may be generated in a mobile station 106 for transmission on the reverse link, or in a base station 104 for transmission on the forward link.

Data received and demodulated in receiver 220 may be delivered to processor 250 for use in voice or data communications, as well as to various other components. Similarly data for transmission may be directed to transmitter 270 from processor 250. For example, various data applications may be present on processor 250, or on another processor included in the wireless communication device 104 or 106 (not shown). Wireless communication device 104 or 106 may include a link to or be incorporated with an external device, such as a laptop computer (not shown).

Processor 250 may be a general-purpose microprocessor, a digital signal processor (DSP), or a special-purpose processor. Processor 250 may perform some or all of the functions of receiver 220, message decoder 230, message generator 260, or transmitter 270, as well as any other processing required by the wireless communication device. Processor 250 may be connected with special-purpose hardware to assist in these tasks (details not shown). Data or voice applications may be external, such as an externally connected laptop computer or connection to a network, may run on an additional processor within wireless communication device 104 or 106 (not shown), or may run on processor 250 itself. Processor 250 is connected with memory 255, which may be used for storing data as well as instructions for performing the various procedures and methods described herein. Those of skill in the art will recognize that memory 255 may be comprised of one or more memory components, of various types, that may be embedded in whole or in part within processor 250.

Figure 3:
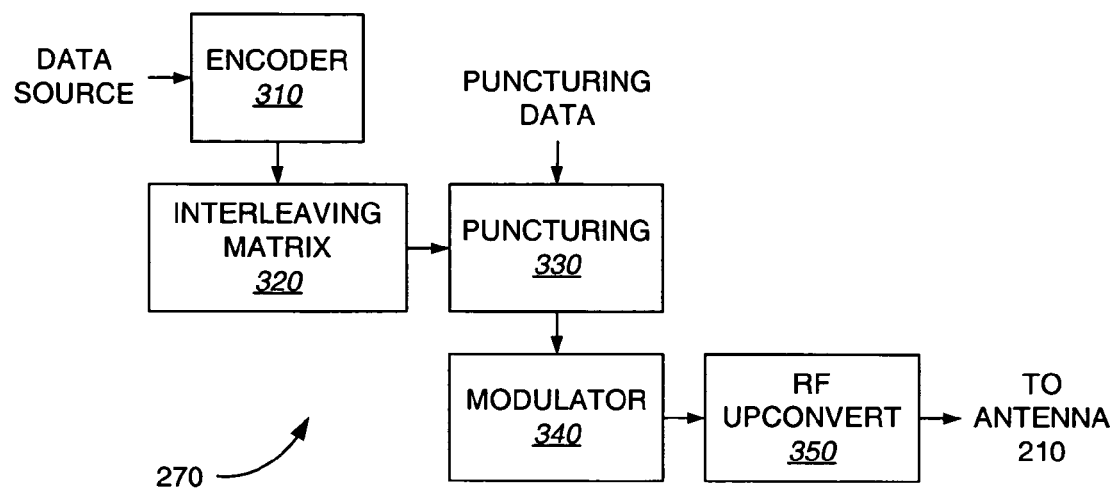
FIG. 3 depicts an example embodiment of a transmitter.

FIG. 3 depicts an example embodiment of a transmitter 270, suitable for deployment in a mobile station 106 or base station 104. Encoder 310 receives data from a data source and encodes the data according to an encoding procedure, such as detailed in a communication standard, i.e., one similar to those described above. In the example embodiment, encoder 310 is a turbo encoder according to the IS-856 specification. Encoder 310 may provide encoded data at a variety of rates. In the example embodiment, rate 1/3 and 1/5 code rates are supported. The output of encoder 310 is processed by interleaving matrix 320, which provides an interleaved, encoded data stream to puncturing block 330. Puncturing is an optional function. Puncturing data may be inserted into the encoded, interleaved data stream, the output is then delivered to modulator 340. Modulator 340 is used to format the data for transmission according to one of a variety of transmission formats. Any number of modulation formats may be deployed, including higher order modulation. In the example embodiment, the modulator may be configured to perform 16 QAM, 8 PSK, or QPSK. The output of modulator 340 is delivered to RF upconvert block 350, where it is formatted for transmission on antenna 210. Various RF transmission techniques are well known in the art and may include amplification, filtering, upconversion mixing, duplexing, etc.

Figure 4:
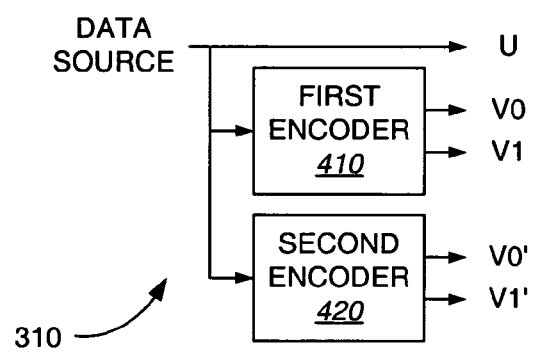
FIG. 4 depicts an example embodiment of an encoder.

FIG. 4 depicts an example embodiment of encoder 310, as described above with respect to FIG. 3. In this example, data from the data source is delivered to a first encoder 410 and a second encoder 420. In the example embodiment, turbo encoding techniques are deployed. The details for encoder 410 and second encoder 420 are detailed in the IS-856 specification, described above. Any number of other encoding techniques may be deployed within the scope of the present invention. The unencoded data bits are passed through encoder 310 and labeled U. For each unencoded data bit, one or more parity bits from each encoder, 410 or 420, may also be generated. Two parity bits, V0 and V1, may be output from first encoder 410. Two parity bits, V0' and V1', are generated from the second encoder 420. In various alternative embodiments, any number of parity bits may be generated by each of the encoders 410 and 420. When rate 1/3 encoding is used, the unencoded bits U and parity bits V0 and V0' are used. When rate 1/5 encoding is deployed, the unencoded bits U, first encoder parity bits V0 and V1, and second encoder parity bits V0' and V1' are used.

In the example embodiment, interleaving matrix 320 carries out interleaving as detailed in the IS-856 specification. The interleaving scheme is based on a row/column structure. For rate 1/3 codes, a code word comprising UV0V0' is used. For rate 1/5 codes a code word UV0V1V0'V1' is used. V0 and V1 are from the first constituent turbo encoder and V0' and V1' are from the second constituent turbo encoder. Interleaving is performed as described below.

Code word symbol are re-ordered into five sequences: U, V0, V0', V1, and V1', where U contains all the information bits, V0 contains all the first parity bits of the first constituent encoder, V0' contains all the first parity bits of the second constituent encoder, V1 contains all the second parity bits of the first constituent encoder, and V1' contains all the second parity bits of the second constituent encoder. The U sequence is written into a matrix of K rows and M columns, by rows. The columns are then permuted in bit-reverse order and each column is end-around shifted.

The V0 sequence and V0' sequence are concatenated, and V0V0' are written into K rows and M columns (with the same number of K as the U sequence and M twice as large as that for the U sequence). Then the columns are permuted in bit-reversed order and each column is end-around shifted.

The V1 sequence and V1' sequence are concatenated, and V1V1' are written into K rows and M columns (with the same number of K as the U sequence and M twice as large as that for the U sequence). Then the columns are permuted in bit-reversed order and each column is end-around shifted.

FIGS. 5-8 depict example interleaver matrix results for several example modulation formats. FIG. 5 shows the output for a 5K packet modulated using 16 QAM, and rate 1/3 encoding. FIG. 6 shows an example interleaving matrix 320 output for a 4K packet modulated using 16 QAM and rate 1/3 encoding. FIG. 7 shows an example interleaving matrix 320 output for a 3K packet modulated using 8 PSK and rate 1/3 encoding. FIG. 8 shows an example interleaving matrix 320 output for a 2K packet modulated using QPSK and rate 1/3 encoding. Various properties of these interleaving formats may be used in the example deinterleaver embodiments detailed below. Not that for QPSK modulation the number of rows in the matrix is two. For 8 PSK modulation the number of rows is three. For 16 QAM modulation the number of rows is four. Modulation is performed by taking a column at a time. That is, two bits in the same column are taken to form one QPSK modulation symbol, a three-bit column is used to form one 8 PSK modulation symbol, and a four-bit column is used to form one 16 QAM modulation symbol. The example interleaving matrices depicted in FIGS. 5-8 illustrate how the code word symbols are organized prior to bit-reverse column permuting and end-around shifting for different modulation styles. The matrices are then permuted based on bit-reversing column order followed by end-around shifting within each column. Note that symbols in the same column will stay together in that same column subsequent to these manipulations. Each column is taken by the modulator as a group to form one modulation symbol. Thus any type of permutation to the interleaving matrices described may be deployed within the scope of the present invention.

Modulator 340 receives a symbol, as described above, and formats that symbol for transmission according to the modulation format desired. For example, the modulator symbol is mapped onto a constellation to generate an In-phase (I) and Quadrature (Q) value for delivery to RF up converter 350, for transmission via antenna 210.

Figure 9:
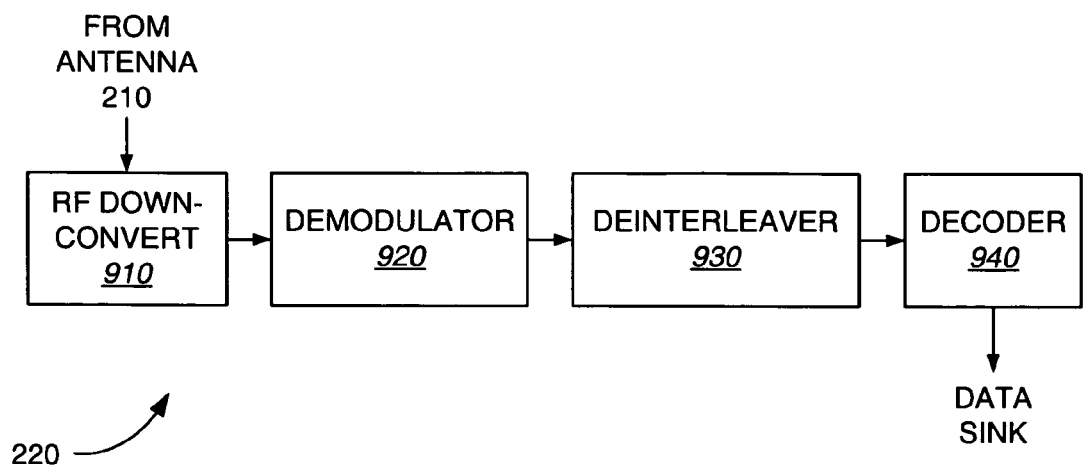
FIG. 9 depicts an example receiver.

FIG. 9 depicts an example receiver 220, suitable for deployment in a base station 104 or a mobile station 106, as detailed above with respect to FIG. 2. Signals are received from antenna 210 and delivered to RF downconvert block 910 where the RF signal is converted to baseband. Baseband signals are delivered to demodulator 920 for demodulation. The demodulator output is delivered to deinterleaver 930 for deinterleaving, as detailed further below. The output of the deinterleaver is delivered to decoder 940 for decoding. The decoded data may be delivered to a data sink. In the example embodiment decoder 940 is a turbo decoder, and deinterleaver 930 deinterleaves according to the IS-856 standard.

Various demodulation techniques are well known in the art. In the example embodiment, demodulator 920 generates, for each demodulator symbol, an I and Q value. The I, Q pair corresponds to a point on a constellation corresponding to the modulation format currently selected.

Figure 10:
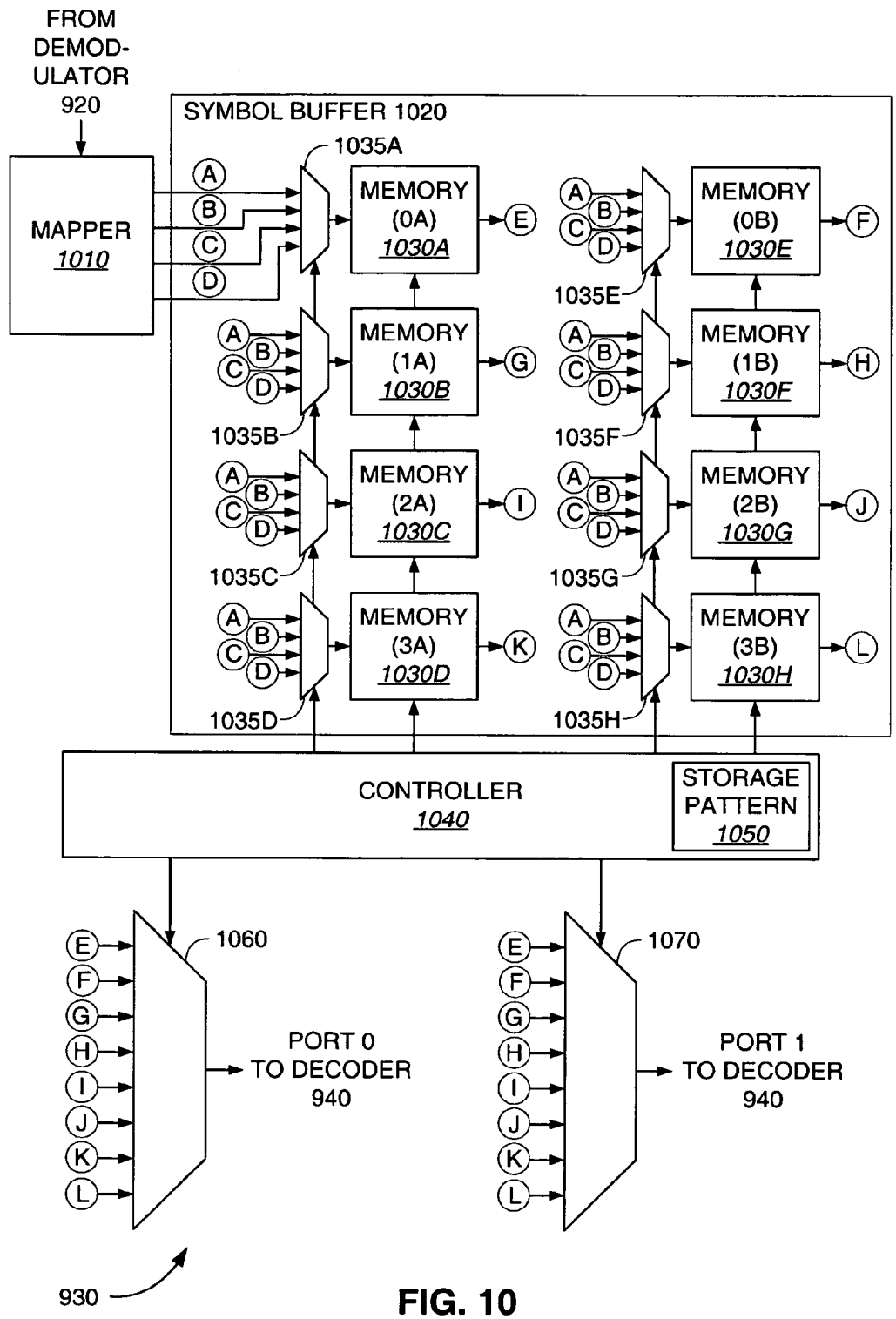
FIG. 10 depicts an example deinterleaver.

An example deinterleaver 930 is depicted in FIG. 10. Deinterleaver 930 receives demodulator symbols from demodulator 920. The symbols are delivered to mapper 1010. Mapper 1010 is used to calculate soft decision values for determining the modulation symbol received. In the example embodiment Log Likelihood Ratio (LLR) symbols are generated. The soft decision values will be used, following interleaving, in the decoder to ultimately determine the most likely decoded data, as detailed further below. In the example embodiment, the LLR symbols are six-bit values. Those of skill in the art will recognize that the LLR values may be of any length, and that other soft decision criteria may be deployed for decoding. Mapper 1010 may be used to perform any type of soft decision value generation. Deinterleaver 930 will serve two purposes. First, it will access the modulation symbols in a way that reverses the interleaving process, calculating the LLR symbols based upon the symbol constellation in mapper 1010. While any number of outputs may be generated in mapper 1010, in the example embodiment the maximum number of LLR symbols is four, identified in FIG. 10 as A, B, C, and D. In an alternate embodiment, higher order modulation formats may be deployed, yielding a greater number of outputs (i.e. 32 QAM generating five outputs, 64 QAM generating six outputs, etc.). Mapper 1010 associates LLR symbols for each output A-D in accordance with the encoding scheme deployed, i.e. permutation, interleaving, etc. Those of skill in the art will recognize that any encoding scheme may be deployed within the scope of the present invention.

The second purpose is to store the calculated LLR symbols into a buffer so that the decoder may operate on the output of the buffer in the most efficient way possible. In the embodiments detailed below all LLR symbols generated for each demodulator output are stored simultaneously, such that there is no need to calculate an LLR more than once. The LLR symbols are stored in such a way that the buffer may be read sequentially to provide a linear data stream for the decoder 940.

For example, when 16 QAM is deployed, four LLR symbols will be generated from each mapped I, Q pair. When 8 PSK is deployed, 3 LLR symbols will be generated. When QPSK is deployed, two LLR symbols will be generated each clock cycle. As detailed further below, the number of computation cycles required may be reduced by storing all the computed LLR symbols, simultaneously, in order.

In the prior art, an example deinterleaver, in order to minimize bandwidth requirements between the demodulator and the deinterleaver, would pick one of the LLR symbols calculated from a column and store it in a symbol buffer. The other three LLR symbols (in a 16 QAM example), although calculated, are discarded. Each LLR symbol is actually calculated four times during the whole deinterleaving process. This extra calculation uses a portion of the limited decoding time, which is undesirable. Furthermore, it consumes unnecessary power, also undesirable in a mobile processor design. The same argument holds true for 8 PSK and QPSK although the extra time and power consumed may not be as great as in the 16 QAM case.

Deinterleaver 930 is designed such that all the LLR symbols are captured and stored when calculated so that no LLR symbol is calculated more than once. This shortens the deinterleaving time by 75 percent for 16 QAM cases, 66 percent for 8 PSK cases, and 50 percent for QPSK cases. These percentages also apply to the power savings achievable in contrast with the prior art example just described.

Returning now to FIG. 5, the 16 QAM example, it is apparent that the code symbols within each column are equally spaced. For example, the four symbols within the first column of the U sequence of the 16 QAM (5K) case are (U0, U1280, U2560, U3840). The four code symbols of the V0/V0' sequence for the same case is (V00, V02560, V0'0, V0'2560). Again, they are equally distant within V0, V0' sequences. Careful examination of all the columns for all the modulation constellations reveals the same equal distance property. This property allows implementation of an efficient storage method, example embodiments of which are described herein. Returning now to FIG. 10, symbol buffer 1020 is deployed as shown containing a plurality of memory banks 1030A-H. Each of the LLR symbols A-D may be selected as the input to any of the eight banks shown. Banks 1030A-1030D are also referred to as the even banks and are labeled 0A-3A. Memory banks 1030E-H may also be referred to as the odd banks and are also labeled 0B-3B. As shown in FIG. 10, multiplexers 1035A-H are used to select one of the symbols for storage in the respective memory bank. The memory banks are adapted to be written to simultaneously. Thus each of the four LLR symbols may be written to a memory bank during each clock cycle. Which memory banks are selected for storing these symbols will be detailed further below. Note that multiplexers 1035A-H are illustrative only. Various other techniques for multiplexing a plurality of inputs to a plurality of destinations are well-known in the art. For example, a tri-state bus may be deployed for each memory bank with tri-state buffers whose inputs correspond to LLR symbols A-D may be deployed. A select line may be used to enable the subset of memory banks for storing before LLR outputs at any time.

Controller 1040 is shown connected to each of the memory banks 1030A-H and multiplexers 1035A-H. Controller 1040 may be used to select which memory banks receive which LLR symbol. Note that, in discussing four LLR symbols, the 16 QAM case is being used as an example. The embodiment shown in FIG. 10 is suitable for use with 8 PSK and QPSK as well, including various buffer sizes and encoding rates as well. The embodiment depicted in FIG. 10 corresponds to the example transmission formats depicted in FIGS. 5-8. However, those of skill in the art will recognize that these general principles apply to a myriad of other combinations as well. The number of memory banks deployed in symbol buffer 1020 corresponds to the number of soft decision symbols that are output from mapper 1010. As discussed above, in this embodiment there may be four, three, or two symbols output from mapper 1010, depending on which transmission format is selected. Additional higher order modulation may be used in an alternate embodiment. For example, if 32 QAM is deployed, then mapper 1010 may produce five symbols. If 64 QAM is deployed, mapper 1010 will produce six symbols, and so on. The number of memory elements 1030 deployed is twice the maximum number of symbols that may be generated at one time. As detailed further below, the eight memory banks in this example embodiment are sufficient for the 16 QAM examples, and may also be used for the lower order modulation as well. Other optional techniques for utilizing the additional banks for lower order modulation will be described below.

The memory banks 1030 deployed in symbol buffer 1020 are sized to accommodate the maximum encoder packet size. In the examples depicted in FIGS. 5-8, a 4K packet and a 5K packet were illustrated for 16 QAM. The allocation of memory bank resources and the scheduling of storing LLR symbols within them is detailed further below. The outputs of memory banks 1030 are labeled with letters E-L. In this example, two memory banks may be read simultaneously to provide two symbols at a time to decoder 940. Multiplexer 1060 receives E-L and is selected to provide one output on a line labeled port 0 to decoder 940. Multiplexer 1070 receives outputs E-L to deliver port 1 to decoder 940. In the example embodiment this multiplexing may be simplified in that the example decoder 940 is a turbo decoder which is fed with the sequential output of the buffers. In each memory access an even and an odd memory bank, at the same address, is addressed for retrieving symbols for delivery to the decoder.

Thus, as each of the LLR symbols are stored in deinterleaved fashion in symbol buffer 1020, the addressing scheme for accessing the stored LLR symbols is simplified greatly. This will become more apparent as example embodiments are detailed further below.

Controller 1040 provides control for the various components described in deinterleaver 930. For example, controller 1040 may provide addresses to each memory bank, select lines for each memory bank, select the input to each memory bank for storing values, provide a write strobe for writing, provide an access strobe for reading values from each memory bank, may select two or more outputs for delivery to output decoder, etc. Controller 1040 may also be used to specify the allocation of LLR symbols A-D from mapper 1010 (details not shown). Various techniques for memory design, reading, writing, and so forth are well-known in the art. Example techniques for generating addresses to provide the deinterleaving desired are detailed further below. In various embodiments, controller 1040 addresses for storing in subsets of banks 1030A-H in accordance with a storage pattern 1050.

Storage pattern 1050 may include one or more storage patterns associated with one or more transmission formats. Examples are detailed further below. In one embodiment, a base address is used for all memory bank storage with an offset value for each individual memory bank to which an LLR symbol is to be stored. The unique offsets and the subset of memory banks selected are determined by the storage pattern 1050. A storage pattern may have a number of cycles, each cycle selecting a different subset of memory banks for storage and a different set of corresponding offsets to be added to the base address. The number of cycles in a storage pattern corresponds to the rate of encoding. For example, the rate 1/3 codes described above generate three encoded symbols for each information symbol. The corresponding number of cycles in a storage pattern is twice the number of encoded symbols. So, rate 1/3 transmission formats utilize a six-cycle storage pattern. Rate 1/5 codes generate five encoded symbols for every information symbol. Thus a storage pattern of ten cycles will be deployed for such a transmission format. Example storage patterns are detailed in Tables 1-4 and described further below.

Storage pattern 1050 may be stored in a memory accessible by controller 1040, and may be implemented as logic or using any other technique, which are well known in the art. Controller 1040 may be a DSP or other microcontroller, a finite state machine, or various other techniques well-known in the art. Storage pattern 1050 may also be stored in memory 255 detailed above with respect to FIG. 2. Controller 1040 may be one of a number of processes running on processor 250, or may be a separate processor or controller.

FIGS. 11-14 depict example configurations of symbol buffer 1020 for four different transmission formats, 16 QAM, 8 PSK, QPSK (1/3), QPSK (1/5), respectively. The overall buffer size is 15K, as shown. This accommodates the maximum number of symbols required for storing an encoded packet, in this example (rate 1/3 encoding of a 5K packet). Again, in this example each memory bank is six bits wide. The even and odd memory banks are labeled A and B, respectively, and there are four pairs of memory banks labeled 0-3, respectively, as shown in FIG. 10.

Figure 11:
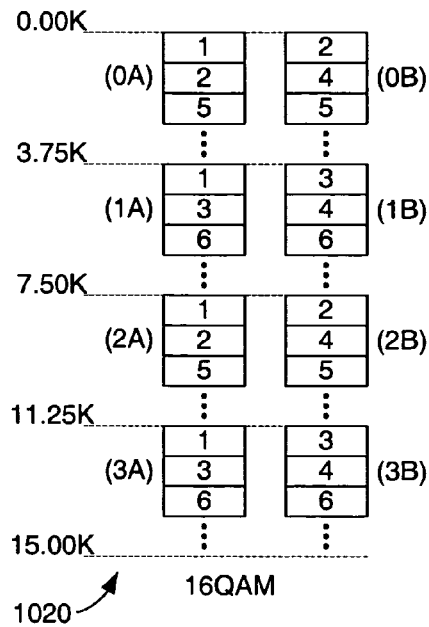
FIG. 11 illustrates an example storing pattern for 16 QAM.
Figure 12:
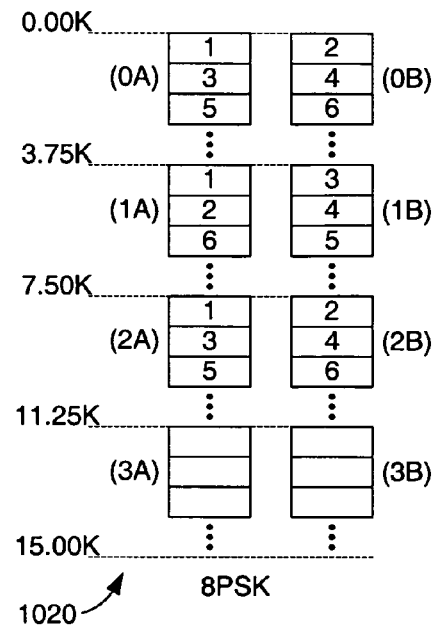
FIG. 12 illustrates an example storing pattern for 8 PSK.
Figure 13:
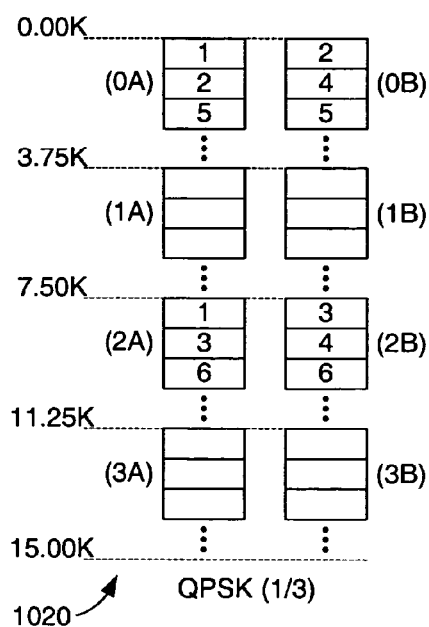
FIG. 13 illustrates an example storing pattern for rate 1/3 QPSK.
Figure 14:
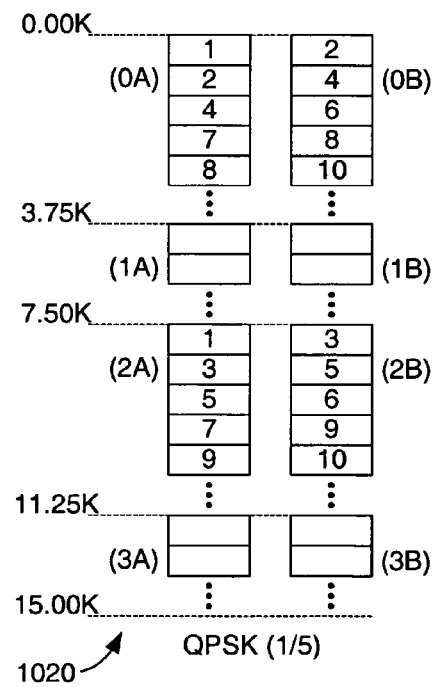
FIG. 14 illustrates an example storing pattern for rate 1/5 QPSK.

16 QAM is depicted in FIG. 11. The number shown in each memory location corresponds to an LLR symbol storage during the corresponding cycle of a storage pattern. It can be seen that the 16 QAM example, in FIG. 11, utilizes each of the memory locations. In FIG. 12, the 8 PSK example uses only the first three pairs of memory banks. The QPSK examples shown in FIGS. 13 and 14 utilize only two pairs of memory banks. The first and third pairs of memory banks are selected, which allows the second and fourth pairs of memory banks to be appended to the first and third pairs to support larger packet sizes, if desired. Note that the rate 1/3 codes, FIGS. 11-13, use a six-cycle storage pattern. The rate 1/5 example, shown in FIG. 14, uses a ten-cycle storage pattern. The pattern shown in each of FIGS. 11-14 may be repeated until the buffer is filled. Thus, as will be detailed further below, for each of the transmission formats, a common address may be used to index the start of the storage pattern.

When each cycle of the storage pattern is complete, the common address may be incremented accordingly. In this example, an even and odd bank are associated with a single address, as will be apparent to one of ordinary skill in the art. Which bank is selected is stored in the storage pattern. It will be clear to those of skill in the art that other storage pattern addressing schemes are anticipated, and fall within the scope of the present invention.

In the example of FIG. 11 the common address is initialized to 0. Thus, in this example, a common address may be initiated to address position 0. The storage pattern is followed for six consecutive cycles, as shown, and then the common address is incremented by three. A bank select line may be used along with the common address and respective offset addresses to provide addressing into banks 1, 2, and 3.

The cycle numbers shown in each of the examples of FIGS. 11-14 indicate where LLR symbols are to be stored during the corresponding cycle. For example, in FIG. 11, during the first cycle banks 0A, 1A, 2A, and 3A are all written with a 0 offset. In the second cycle banks 0B, 2A, and 2B are written, offset as shown. The pattern cycle for the 16 QAM example of FIG. 11 is detailed in Table 1. In Table 1, during cycle 1, four banks are selected (0-3, in the first cycle, for example), an even/odd indicator to identify whether the A or B bank is selected (all even, or A, in this example), and a pointer offset (all 0 in this example). The table also indicates which type of symbol is being written at the time. In cycle 1 each symbol corresponds to a U symbol. V0 and V0' symbols are written in subsequent cycles, as shown. It can be seen that if the pattern of Table 1 is followed, the memory banks will be written to as shown in FIG. 11. Tables 2-4 are similar storage patterns corresponding to the transmission formats of FIGS. 12-14, 8 PSK, rate 1/3, QPSK, and rate 1/5 QPSK, respectively.

TABLE 1

16 QAM

| Pattern Cycle | Bank Select | Even/Odd (A/B) | Pointer Offset | LLR Select |
|---|---|---|---|---|
| 1 | 0 | A | 0 | U |
|   | 1 | A | 0 | U |
|   | 2 | A | 0 | U |
|   | 3 | A | 0 | U |
| 2 | 0 | B | 0 | V0 |
|   | 0 | A | 1 | V0' |
|   | 2 | B | 0 | V0 |
|   | 2 | A | 1 | V0' |
| 3 | 1 | B | 0 | V0 |
|   | 1 | A | 1 | V0' |
|   | 3 | B | 0 | V0 |
|   | 3 | A | 1 | V0' |
| 4 | 0 | B | 1 | U |
|   | 1 | B | 1 | U |
|   | 2 | B | 1 | U |
|   | 3 | B | 1 | U |
| 5 | 0 | A | 2 | V0 |
|   | 0 | B | 2 | V0' |

TABLE 1-continued

16 QAM

| Pattern Cycle | Bank Select | Even/Odd (A/B) | Pointer Offset | LLR Select |
|---|---|---|---|---|
|   | 2 | A | 2 | V0 |
|   | 2 | B | 2 | V0' |
| 6 | 1 | A | 2 | V0 |
|   | 1 | B | 2 | V0' |
|   | 3 | A | 2 | V0 |
|   | 3 | B | 2 | V0' |

TABLE 2

8 PSK

| Pattern Cycle | Bank Select | Even/Odd (A/B) | Pointer Offset | LLR Select |
|---|---|---|---|---|
| 1 | 0 | A | 0 | U |
|   | 1 | A | 0 | U |
|   | 2 | A | 0 | U |
| 2 | 0 | B | 0 | V0 |
|   | 1 | A | 1 | V0 |
|   | 2 | B | 0 | V0' |
| 3 | 0 | A | 1 | V0 |
|   | 1 | B | 0 | V0' |
|   | 2 | A | 1 | V0' |
| 4 | 0 | B | 1 | U |
|   | 1 | B | 1 | U |
|   | 2 | B | 1 | U |
| 5 | 0 | A | 2 | V0 |
|   | 1 | B | 2 | V0 |
|   | 2 | A | 2 | V0' |
| 6 | 0 | B | 2 | V0 |
|   | 1 | A | 2 | V0' |
|   | 2 | B | 2 | V0' |

TABLE 3

QPSK (1/3)

| Pattern Cycle | Bank Select | Even/Odd (A/B) | Pointer Offset | LLR Select |
|---|---|---|---|---|
| 1 | 0 | A | 0 | U |
|   | 2 | A | 0 | U |
| 2 | 0 | B | 0 | V0 |
|   | 0 | A | 1 | V0' |
| 3 | 2 | B | 0 | V0 |
|   | 2 | A | 1 | V0' |
| 4 | 0 | B | 1 | U |
|   | 2 | B | 1 | U |
| 5 | 0 | A | 2 | V0 |
|   | 0 | B | 2 | V0' |
| 6 | 2 | A | 2 | V0 |
|   | 2 | B | 2 | V0' |

TABLE 4

QPSK (1/5)

| Pattern Cycle | Bank Select | Even/Odd (A/B) | Pointer Offset | LLR Select |
|---|---|---|---|---|
| 1 | 0 | A | 0 | U |
|   | 2 | A | 0 | U |
| 2 | 0 | B | 0 | V0 |
|   | 0 | A | 1 | V0' |
| 3 | 2 | B | 0 | V0 |
|   | 2 | A | 1 | V0' |
| 4 | 0 | B | 1 | V1 |

TABLE 4-continued

QPSK (1/5)

| Pattern Cycle | Bank Select | Even/Odd (A/B) | Pointer Offset | LLR Select |
|---|---|---|---|---|
|   | 0 | A | 2 | V1' |
| 5 | 2 | B | 1 | V1 |
|   | 2 | A | 2 | V1' |
| 6 | 0 | B | 2 | U |
|   | 2 | B | 2 | U |
| 7 | 0 | A | 3 | V0 |
|   | 2 | A | 3 | V0 |
| 8 | 0 | B | 3 | V0' |
|   | 0 | A | 4 | V1 |
| 9 | 2 | B | 3 | V0' |
|   | 2 | A | 4 | V1 |
| 10 | 0 | B | 4 | V1' |
|   | 2 | B | 4 | V1' |

Figure 15:
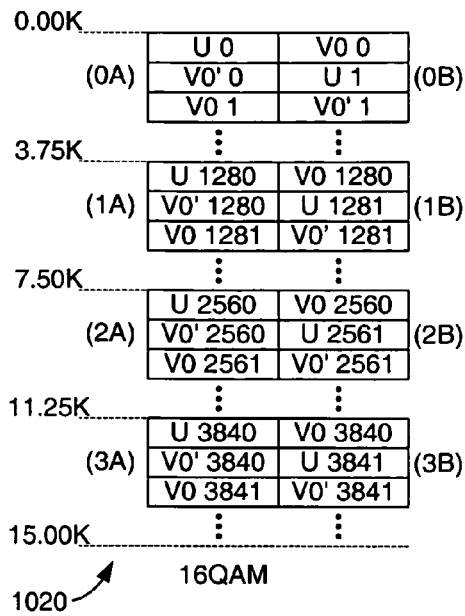
FIG. 15 depicts an example configuration of a symbol buffer for 16 QAM.
Figure 16:
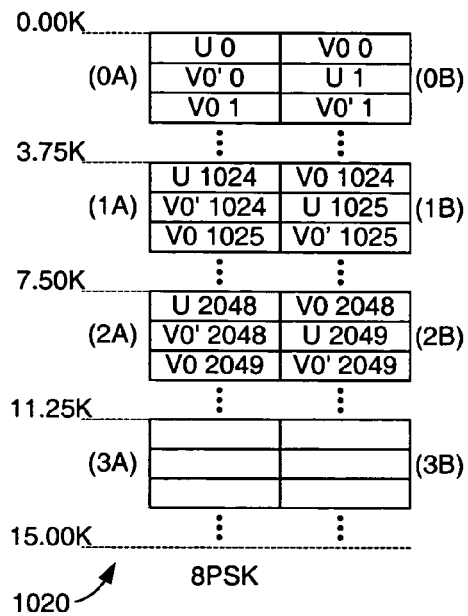
FIG. 16 depicts an example configuration of a symbol buffer for 8 PSK.
Figure 17:
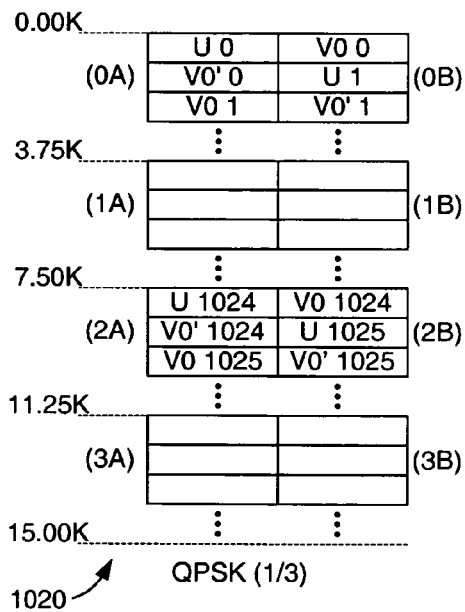
FIG. 17 depicts an example configuration of a symbol buffer for rate 1/3 QPSK.
Figure 18:
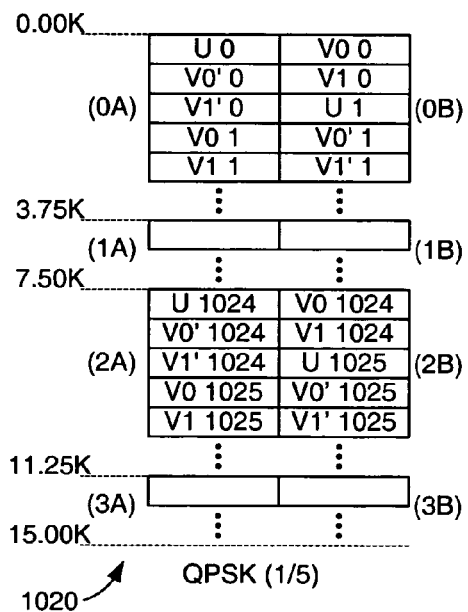
FIG. 18 depicts an example configuration of a symbol buffer for rate 1/5 QPSK.

FIGS. 15-18 show symbol buffer 1020 for each of the respective transmission formats described with respect to FIGS. 11-14. FIG. 15, for example, depicts the 16 QAM case. It can be seen that U0, U1280, U2560, and U3840, all of which are calculated from a single I, Q pair, are stored simultaneously during cycle 1 to banks 0A-3A. As the storage cycle is followed, each information and parity bit will be stored such that the index will increase linearly from 0 to the end of the packet. Thus when delivering the LLR symbol values to the decoder 940, a simple linear addressing scheme may be deployed. The two port memory, depicted in FIG. 10, allows two banks to be accessed simultaneous, as described above. FIGS. 16-18 show similar examples of demodulated and deinterleaved symbols being stored for the transmission formats corresponding to FIGS. 12-14, respectively.

Note that the rate 1/5 case, depicting in FIG. 18, illustrates a ten-cycle storage pattern in contrast to the six-cycle storage patterns depicted in FIGS. 15-17. Thus for the example symbol buffer 1020 deployed to support the IS-856 interleaving formats, the interleaver 930 may be deployed as follows: eight memory banks, each with 1.875K locations, six bits wide. (Again, the 1.875K size is determined according to the largest packet size of 5K and its code rate of 1/3, requiring a total of 15K storage locations. Alternate sizes may be deployed for alternate embodiments supporting different packet sizes.) The storage is performed in such a way that any two consecutive addresses point to two different memory banks and any two addresses that are 1/4 of the total storage apart also point to a different physical memory bank. This corresponds to the equal distant property described earlier. Again, note that all memory locations are not filled by the end of the deinterleaving, except for the largest packet size. Nonetheless, even with smaller packet sizes, the addresses to access the filled locations in sequential order increase linearly as desired for delivery to the turbo decoder in the example embodiment.

Figure 19:
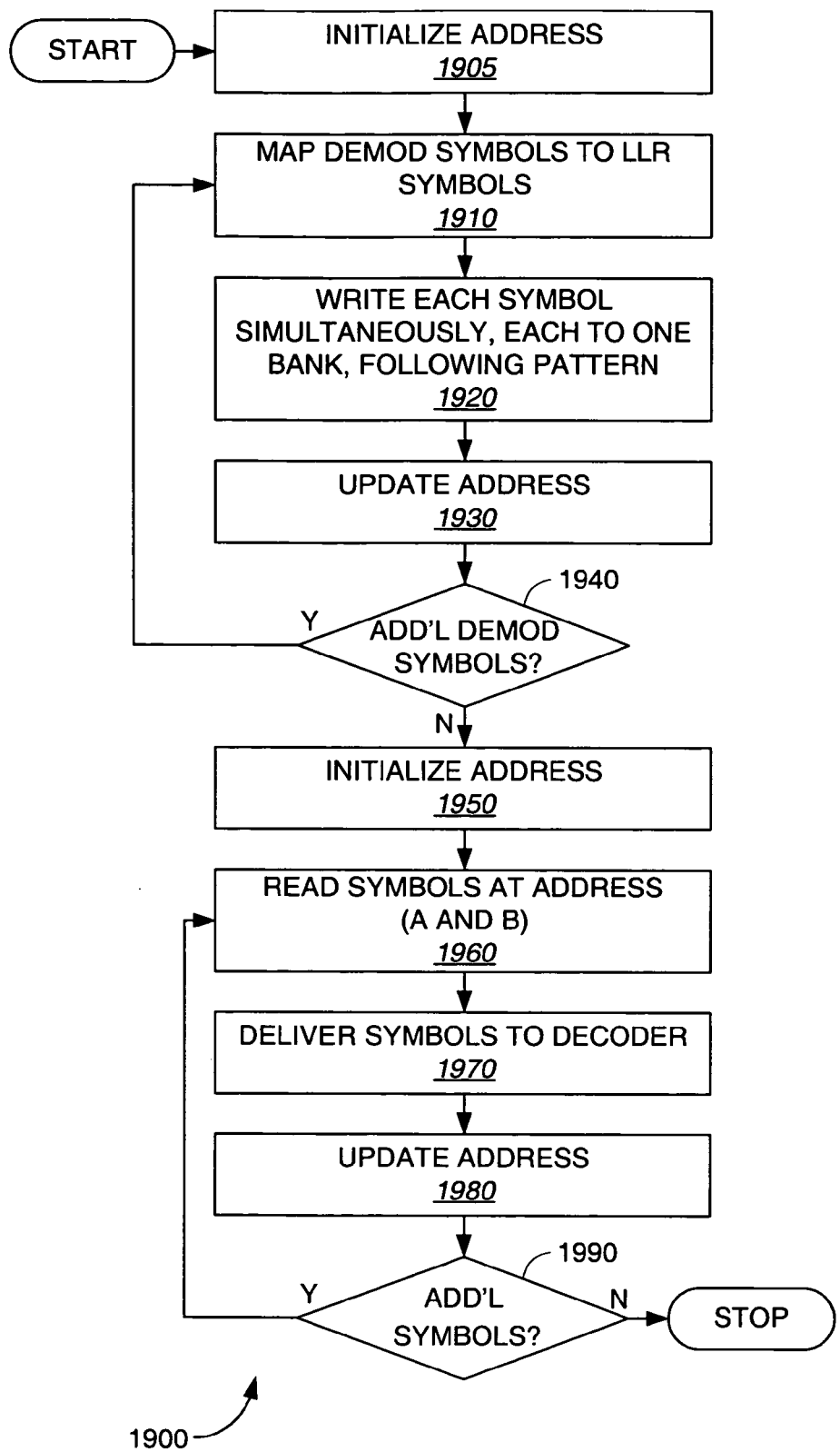
FIG. 19 depicts a flowchart of an example embodiment of a deinterleaving method.

FIG. 19 depicts method 1900 for deinterleaving, suitable for deployment in deinterleaver 930, as described above. The process beings in block 1905 where a common address is initialized. In block 1910, demodulation symbols are mapped to LLR symbols (or other soft decision symbols), according to the constellation corresponding to the currently selected transmission format. In block 1920, write each LLR symbol simultaneously, each to one memory bank following a storage pattern. An example of this block will be detailed further below with respect to FIG. 20.

In block 1930 update the common address. Those of skill in the art will recognize the increment required to update the address according to the number of cycles in the storage pattern, as described above. For example, with a storage pattern of six, using even and odd banks, the common address is incremented by three subsequent to each storage pattern. As another example, when rate 1/5 encoding is used, the number of cycles in the storage pattern is ten. Thus, for an embodiment deploying even and odd banks, as described above with respect to FIG. 10, the common address will be updated with an increment of five subsequent to the completion of the storage pattern.

In decision block 1940, if there are additional demodulation symbols to deinterleave, return to block 1910 and proceed as described above. If not, proceed to block 1950 to initialize the address for reading the symbol buffer. In one example, using 16 QAM with a 5K packet size, the entire contents of the symbol buffer may be read sequentially starting at address 0 through address 15K. Those of skill in the art will recognize that select lines for banks 1, 2, and 3 may substitute for additional address bits corresponding to addresses up to 15K. In the 8 PSK example depicted in FIGS. 12 and 16 above, the first three pairs of buffers may be read sequentially. In the QPSK examples, the first and third buffers may be read sequentially, and so forth.

In block 1960, symbols are read at the initialized address. In the example embodiment, a two-port memory is deployed, so both the even and odd memory banks may be accessed at once. In alternate embodiments any number of memory banks may be made simultaneously accessible, as will be readily apparent to those of skill in the art. In block 1970 the accessed symbols are delivered to the decoder for decoding. In block 1980 the address is updated. In this example, the address is updated by simply incrementing by one. In some embodiments, when access of the stored values in a memory bank or pair of memory banks has been exhausted, a new pair of banks may be selected.

In decision block 1990, if there are additional symbols to be read out of the symbol buffer, return to block 1960 and proceed as described above. If not, the process may stop. Note that the process of deinterleaving and delivering deinterleaved symbols to the decoder may be repeated indefinitely, as desired.

Figure 20:
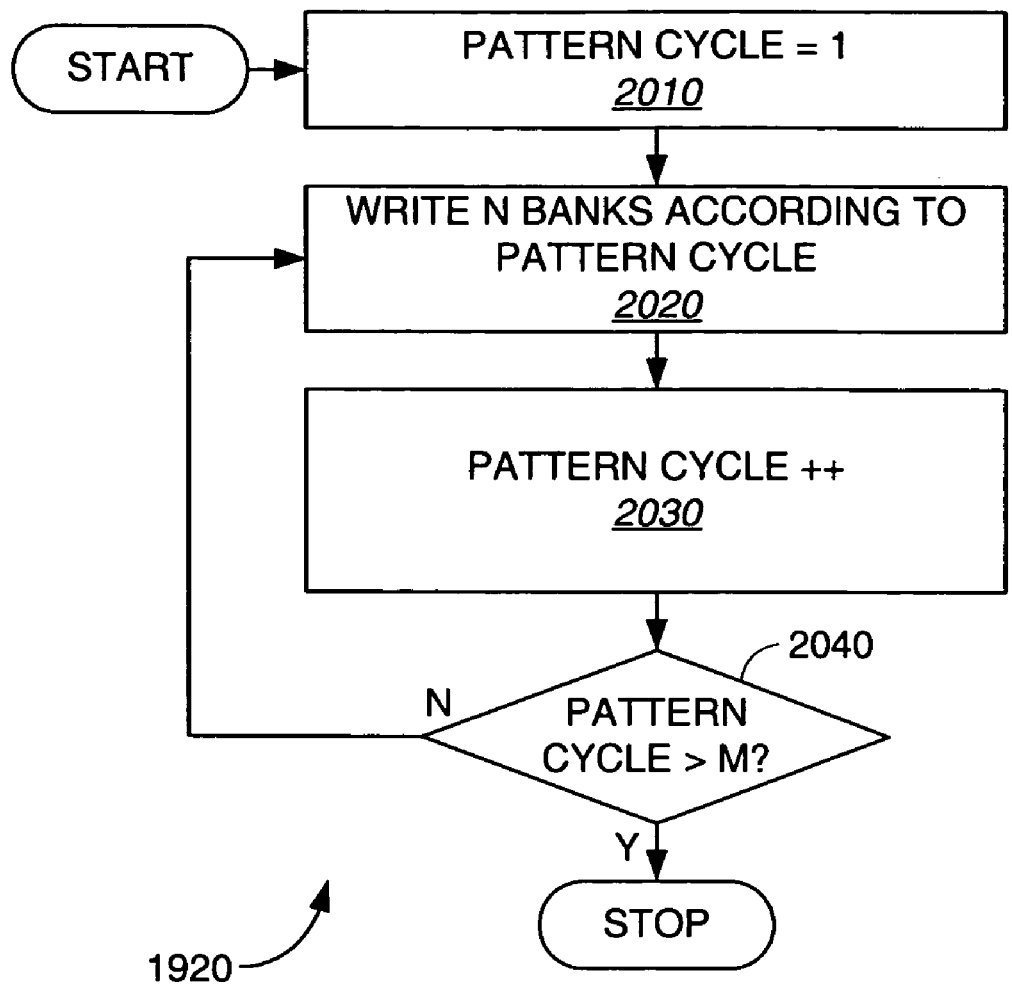
FIG. 20 depicts a flowchart of an example embodiment of a method for writing memory banks according to a storing pattern.

FIG. 20 depicts an example embodiment of block 1920, described above. The process beings in block 2010 where the pattern cycle is initialized to one. In block 2020 write to banks according to the pattern cycle. This may be determined from a storage pattern, i.e. storage pattern 1050, described above. N is determined according to the transmission former. For example, for 16 QAM N equals four, for 8 PSK N equals three, and for QPSK N equals two. In block 2030 increment the pattern cycle number by one to perform the next cycle in the storage pattern. In decision block 2040 if the pattern cycle is greater than M the process has completed for this pattern and may stop. If not, return to block 2020 to continue on with the next cycle in the pattern. M is determined according to the number of encoded symbols, i.e. the encoding rate. For example, the rate 1/3 codes described above correspond to a pattern cycle where M equals six. The rate 1/5 codes described above correspond to M equal to ten.

It should be noted that in all the embodiments described above, method steps can be interchanged without departing from the scope of the invention. The descriptions disclosed herein have in many cases referred to signals, parameters, and procedures associated with an IS-856 system, but the scope of the present invention is not limited as such. Those of skill in the art will readily apply the principles herein to various other communication systems. These and other modifications will be apparent to those of ordinary skill in the art.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus, comprising:
a mapper receiving at least one pair of received symbol values, each pair of received symbol values comprising a first value and a second value, and generating a plurality of third values in response to the at least one pair of received symbol values;
a plurality of memory banks, each memory bank adaptable to store one of the third values; and
a controller directing each of the plurality of third values to a selected one of the plurality of memory banks for simultaneous storing according to a storing pattern, the storing pattern determined to allow for deinterleaving by retrieving values from the plurality of memory banks;
wherein the storing pattern comprises a plurality of cycles, each cycle indicating a selected subset of the plurality of memory banks and an address offset value for each memory bank in the selected subset, each of the memory banks in the selected subset for storing one of the plurality of third values, respectively;
wherein the number of cycles is six, and wherein:
the first cycle indicates first, third, fifth, and seventh memory banks are selected, with an offset of zero;
the second cycle indicates first, second, fifth, and sixth memory banks are selected, with respective offsets of one, zero, one, and zero;
the third cycle indicates second, third, seventh, and eighth memory banks are selected, with respective offsets of one, zero, one, and zero;
the fourth cycle indicates second, fourth, sixth, and eighth memory banks are selected, with an offset of one;
the fifth cycle indicates first, second, fifth, and sixth memory banks are selected, with an offset of two; and
the sixth cycle indicates second, third, seventh, and eighth memory banks are selected, with an offset of two.

2. An apparatus, comprising:
a mapper receiving at least one pair of received symbol values, each pair of received symbol values comprising a first value and a second value, and generating a plurality of third values in response to the at least one pair of received symbol values;
a plurality of memory banks, each memory bank adaptable to store one of the third values; and
a controller directing each of the plurality of third values to a selected one of the plurality of memory banks for simultaneous storing according to a storing pattern, the storing pattern determined to allow for deinterleaving by retrieving values from the plurality of memory banks;
wherein the storing pattern comprises a plurality of cycles, each cycle indicating a selected subset of the plurality of memory banks and an address offset value for each memory bank in the selected subset, each of the memory banks in the selected subset for storing one of the plurality of third values, respectively;
wherein the number of cycles is six, and wherein:
the first cycle indicates first, third, and fifth memory banks are selected, with an offset of zero;
the second cycle indicates second, third, and sixth memory banks are selected, with respective offsets of zero, one, and zero;
the third cycle indicates first, fourth, and fifth memory banks are selected, with respective offsets of one, zero, and one;
the fourth cycle indicates second, fourth, and sixth memory banks are selected, with an offset of one;
the fifth cycle indicates first, fourth, and fifth memory banks are selected, with an offset of two; and
the sixth cycle indicates second, third, and sixth memory banks are selected, with an offset of two.

3. An apparatus, comprising:
a mapper receiving at least one pair of received symbol values, each pair of received symbol values comprising a first value and a second value, and generating a plurality of third values in response to the at least one pair of received symbol values;
a plurality of memory banks, each memory bank adaptable to store one of the third values; and
a controller directing each of the plurality of third values to a selected one of the plurality of memory banks for simultaneous storing according to a storing pattern, the storing pattern determined to allow for deinterleaving by retrieving values from the plurality of memory banks;
wherein the storing pattern comprises a plurality of cycles, each cycle indicating a selected subset of the plurality of memory banks and an address offset value for each memory bank in the selected subset, each of the memory banks in the selected subset for storing one of the plurality of third values, respectively;
wherein the number of cycles is six, and wherein:
the first cycle indicates first and third memory banks are selected, with an offset of zero;
the second cycle indicates second and first memory banks are selected, with respective offsets of zero and one;
the third cycle indicates fourth and third memory banks are selected, with respective offsets of zero and one;
the fourth cycle indicates second and fourth memory banks are selected, with an offset of one;
the fifth cycle indicates first and second memory banks are selected, with an offset of two; and
the sixth cycle indicates third and fourth memory banks are selected, with an offset of two.

4. An apparatus, comprising:
a mapper receiving at least one pair of received symbol values, each pair of received symbol values comprising a first value and a second value, and generating a plurality of third values in response to the at least one pair of received symbol values;
a plurality of memory banks, each memory bank adaptable to store one of the third values; and
a controller directing each of the plurality of third values to a selected one of the plurality of memory banks for simultaneous storing according to a storing pattern, the storing pattern determined to allow for deinterleaving by retrieving values from the plurality of memory banks;
wherein the storing pattern comprises a plurality of cycles, each cycle indicating a selected subset of the plurality of memory banks and an address offset value for each memory bank in the selected subset, each of the memory banks in the selected subset for storing one of the plurality of third values, respectively;
wherein the number of cycles is ten, and wherein:
the first cycle indicates first and third memory banks are selected, with an offset of zero;
the second cycle indicates second and first memory banks are selected, with respective offsets of zero and one;
the third cycle indicates fourth and third memory banks are selected, with respective offsets of zero and one;
the fourth cycle indicates second and first memory banks are selected, with respective offsets of one and two;

the fifth cycle indicates fourth and third memory banks are selected, with respective offsets of one and two;

the sixth cycle indicates second and fourth memory banks are selected, with an offset of two;

the seventh cycle indicates first and third memory banks are selected, with an offset of three;

the eighth cycle indicates second and first memory banks are selected, with respective offsets of three and four;

the ninth cycle indicates fourth and third memory banks are selected, with respective offsets of three and four; and the tenth cycle indicates second and fourth memory banks are selected, with an offset of four.

5. An apparatus, comprising:

a mapper receiving at least one pair of received symbol values, each pair of received symbol values comprising a first value and a second value, and generating a plurality of third values in response to the at least one pair of received symbol values;

a plurality of memory banks, each memory bank adaptable to store one of the third values; and a controller directing each of the plurality of third values to a selected one of the plurality of memory banks for simultaneous storing according to a storing pattern, the storing pattern determined to allow for deinterleaving by retrieving values from the plurality of memory banks; and a plurality of muxes for receiving the plurality of third values and delivering selected third values to each of the respective plurality of memory banks, the third values selected by the controller.

6. The apparatus of claim 5, wherein the first and second values are in-phase (I) and quadrature (Q) values, respectively.

7. The apparatus of claim 5, wherein the third values are soft decision values.

8. The apparatus of claim 5, wherein the third values are Log Likelihood Ratio (LLR) values.

9. The apparatus of claim 5, the number of memory banks being equal to twice the number of third values.

10. The apparatus of claim 5, wherein two or more stored third values may be retrieved from two or more of the plurality of memory banks simultaneously.

11. The apparatus of claim 5, wherein the storing pattern is selectable from a plurality of storage patterns, the storing pattern being selected in accordance with one of a plurality of transmission formats.

12. The apparatus of claim 11, wherein the plurality of transmission formats comprises 16 Quadrature Amplitude Modulation (QAM).

13. The apparatus of claim 11, wherein the plurality of transmission formats comprises rate 1/3 encoding.

14. The apparatus of claim 5, wherein the plurality of memory banks are sized in accordance with one or more encoder packet sizes.

15. The apparatus of claim 5, wherein the storing pattern comprises a plurality of cycles, each cycle indicating a selected subset of the plurality of memory banks and an address offset value for each memory bank in the selected subset, each of the memory banks in the selected subset for storing one of the plurality of third values, respectively.

16. The apparatus of claim 15, wherein the bank selection, offset selection, and third value selection are assigned in accordance with an encoding sequencing pattern.

17. The apparatus of claim 15, wherein the number of cycles in the storage pattern is twice the number of encoded symbols in an associated encoding sequence pattern.

18. The apparatus of claim 5, wherein the controller produces a storing address for one or more memory banks according to the storing pattern, each storing address computed using a base address added to an offset indicated by the storing pattern, the base address incremented by a fixed amount subsequent to completion of each successive iteration of the storing pattern.

19. The apparatus of claim 18, wherein the base value is set to an initial value and reset to the initial value once a predetermined number of third values have been stored.

20. The apparatus of claim 5, wherein the controller selects two or more memory banks for simultaneous retrieval of stored third values according to an address, the address being incremented sequentially subsequent to each simultaneous retrieval.

21. The apparatus of claim 5, further comprising a decoder for receiving a series of two or more third values and decoding a plurality of fifth values therefrom.

22. The apparatus of claim 21, wherein the decoder is a turbo decoder.

23. The apparatus of claim 5, further comprising a demodulator for demodulating a received signal to produce the first and second values.

24. An apparatus, comprising:

a mapper receiving at least one pair of received symbol values, each pair of received symbol values comprising a first value and a second value, and generating a plurality of third values in response to the at least one pair of received symbol values;

a plurality of memory banks, each memory bank adaptable to store one of the third values; and a controller directing each of the plurality of third values to a selected one of the plurality of memory banks for simultaneous storing according to a storing pattern, the storing pattern determined to allow for deinterleaving by retrieving values from the plurality of memory banks; and a plurality of tri-state buses connected to the plurality of memory banks, each tri-state bus for receiving a third value, selectable by the controller, and each memory bank operable to store the value of the respective tri-state bus as directed by the controller.

25. A wireless communication system including a deinterleaver, comprising:

a mapper receiving at least one pair of received symbol values, each pair of received symbol values comprising a first value and a second value, and generating a plurality of third values in response to at least one pair of received symbol values;

a plurality of memory banks, each memory bank adaptable to store one of the third values;

a controller directing each of the plurality of third value to a selected one of the plurality of memory banks for simultaneous storing according to a storing pattern, the storing pattern determined to allow for deinterleaving by retrieving values from the plurality of memory banks; and a plurality of muxes for receiving the plurality of third values and delivering selected third values to each of the respective plurality of memory banks, the third values selected by the controller.

26. A device, comprising:
means for receiving at least one pair of received symbol values, each pair of received symbol values comprising a first value and a second value,
means for mapping at least a first and second value to a plurality of third values, in response to at least one pair of received symbol values;
means for receiving the plurality of third values and delivering selected third values to each of the respective plurality of the memory banks, the third values selected by a controller; and
means for simultaneously storing the plurality of third values in a plurality of memory banks according to a storing pattern, the storing pattern determined to allow for deinterleaving by retrieving values from the plurality of memory banks.

27. A method of deinterleaving, comprising:
receiving at least one pair of received symbol values, each pair of received symbol values comprising a first value and a second value;
mapping at least a first and second value to a plurality of third values, in response to at least one pair of received symbol values;
receiving the plurality of third values and delivering selected third values to each of the respective plurality of memory banks, the third values selected by a controller; and
simultaneously storing the plurality of third values in a plurality of memory banks according to a storing pattern, the storing pattern determined to allow for deinterleaving by retrieving values from the plurality of memory banks.

28. The method of claim 27, further comprising:
producing a storing address for one or more memory banks according to the storing pattern, each storing address computed using a base address added to an offset indicated by the storing pattern; and
incrementing the base address by a fixed amount subsequent to completion of each successive iteration of the storing pattern.

29. The method of claim 27, wherein the storing pattern comprises a plurality of cycles, each cycle indicating a selected subset of the plurality of memory banks and an address offset value for each memory bank in the selected subset, each of the memory banks in the selected subset for storing one of the plurality of third values, respectively.

30. The method of claim 27, further comprising:
simultaneously retrieving two or more stored third values from two or more memory banks according to a retrieval address; and
incrementing the retrieval address sequentially subsequent to a simultaneous retrieval.

31. The method of claim 30, further comprising delivering the retrieved stored third values to a decoder for subsequent decoding therefrom.

32. The method of claim 27, wherein each first value is an in-phase (I) value, and each second value is a quadrature (Q) value, the method further comprising demodulating received symbols to obtain the at least one pair of received symbol values.

33. The method of claim 27, wherein the step of mapping is performed so that each of the third values is a soft decision value.

34. The method of claim 27, wherein the step of mapping is performed so that each of the third values is a Log Likelihood Ratio (LLR) value.

35. The method of claim 27, wherein the step of storing is performed so that the number of the memory banks is equal to twice the number of third values.

36. The method of claim 27, further comprising simultaneously retrieving two or more stored third values from two or more of the plurality of memory banks.

37. The method of claim 27, further comprising:
demodulating received symbols to obtain the at least one pair of received symbol values; and
determining the storing pattern in accordance with a transmission format of the received symbols.

38. The method of claim 37, wherein the transmission format is selected from a group consisting of rate 1/3 encoding and rate 1/5 encoding.

39. The method of claim 37, wherein the transmission format is selected from a group consisting of 16 Quadrature Amplitude Modulation (QAM), 8 Phase-Shift Keying (8 PSK), and Quadrature Phase-Shift Keying (QPSK).

40. The method of claim 27, wherein the storing pattern comprises a plurality of cycles, each cycle indicating a selected subset of the plurality of memory banks and an address offset value for each memory bank in the selected subset, each of the memory banks in the selected subset for storing one of the plurality of third values, respectively.

41. The method of claim 27, further comprising:
generating storing addresses for one or more memory banks according to the storing pattern, each storing address being computed using a base address added to an offset indicated by the storing pattern, the base address incremented by a fixed amount subsequent to completion of each successive iteration of the storing pattern.

42. The method of claim 27, further comprising:
selecting two or more memory banks and simultaneously retrieving stored third values according to an address; and
incrementing the address sequentially after the step of simultaneously retrieving.

* * * * *